United States Patent [19]
Mil'shtein et al.

[11] Patent Number: 6,037,830
[45] Date of Patent: Mar. 14, 2000

[54] TAILORED FIELD IN MULTIGATE FETS

[75] Inventors: Samson Mil'shtein, Chelmsford; Sergey Nabokin; Shixian Sui, both of Lowell, all of Mass.

[73] Assignee: University of Massachusetts Lowell, Lowell, Mass.

[21] Appl. No.: 09/074,770

[22] Filed: May 8, 1998

[51] Int. Cl.[7] .............................................. H03K 17/785
[52] U.S. Cl. .......................................... 327/427; 327/434
[58] Field of Search .................................. 327/427, 430, 327/431, 434, 435, 436, 437, 530, 538, 541, 543

[56] References Cited

U.S. PATENT DOCUMENTS

| | | | |
|---|---|---|---|
| 3,772,614 | 11/1973 | Kjaersgaard | 332/16 T |
| 3,831,111 | 8/1974 | Lafferty | 331/116 R |
| 4,264,981 | 4/1981 | Vilimek | 455/333 |
| 4,700,461 | 10/1987 | Choi et al. | 437/41 |

OTHER PUBLICATIONS

P. Muzumdar, et al. "Improved Performance of a Field Effect Transistor," *Superlattices and Microstructures*, 8 (4): 357–359 (1990).

P. Muzumdar, et al. "Observation of negative differential resistance in GaAs field–effect transistors" *J. Appl. Phys.* 70 (2): 1063–1065 (Jul. 15, 1991).

*Primary Examiner*—Tuan T. Lam
*Attorney, Agent, or Firm*—Hamilton, Brook, Smith & Reynolds, P.C.

[57] ABSTRACT

A uniform tailored electrical field in a multigate field effect D-mode transistor is automatically provided by a feedback circuit which couples drain bias voltages to the gates of a multigate transistor to bias the gates incrementally such that the highest voltage is applied to the gate nearest the drain while the lowest voltage is applied to the gate nearest the source. E-mode multigate FET's carry higher gate voltage on the gate close to the source compared to a gate voltage on a last gate, located close to the drain. The proper distribution of gate voltages improves the transconductance $G_m$ of the transistor and decreases gate capacitance $C_{gs}$, which increases the speed of operation of a multigate FETs.

17 Claims, 2 Drawing Sheets

TAILORED FIELD IN MULTIGATE FETS

BACKGROUND OF THE INVENTION

A well known conventional Field Effect Transistor (FET), whether metal semiconductor (MESFET), metal-oxide semiconductor (MOSFET), or heterostructure transistor (HEMT) is comprised of a source region or contact and a drain region or contact formed over a channel region. A gate region is formed over the channel between the source and drain. The FET is formed by well-known semiconductor processes including photolithography, diffusion and deposition of metals. An FET may have an n or p-type conductivity channel. The mechanism of operation divides all FETs into either depletion or enhancement mode operation.

A schematic of a prior art MESFET 10 operated in D-mode is shown in FIG. 1 to comprise a source region S and a drain region D with a gate region G laterally disposed between the source S and drain D and overlying a channel region generally shown as C. Superimposed on the MESFET is a curve $P_1$ (shown in solid lines) of the E-field (E) in volts per centimeter (V/cm) plotted along the channel length L from O to L. When a single gate n-channel MESFET is operated in the depletion mode a negative or (positive) voltage $V_g$. is applied to the gate G while the source S is grounded and the drain is under few volts of (positive) bias or negative depending upon the type of conductivity in the channel. Interaction of the gate and a drain potentials creates a nonuniform electric field. The signature of this nonuniformity is a shape of a depleted or enhanced region in various FETs as shown in the solid line profile $P_1$ in the schematics of MESFET 10. In D-mode (depleted mode) MESFET operation of a single gate device, the weak electrical field at the source side results in slow moving electrons, a large opening of the channel C, and high parasitic capacitance $C_{gs}$ between the source S and gate G, which in turn impacts the performance of the MESFET. As a result, the velocity profile of the electrons in the channel of the single-gate FET is not efficient. As a matter of fact, the electrons reach their peak velocity, when they have traveled more than seventy percent of the channel C from the source S side to the drain D side of the channel. In E-mode (enhanced mode) transistors such as MISFETs, MOSFETs and alike the shape of the field $P_2$ is shown in FIG. 2. The electron velocity profiles and $C_{gs}$ are opposite to what was shown in FIG. 1 and described above for D-mode devices.

The problem of non-uniformity of the electric field caused by the drain voltage, has been solved in the past by the concept of tailoring the field. The basic idea of the tailored field is to create a uniform electric field throughout the channel C, which would significantly counteract the effect of the drain voltage $V_d$ and increase the electron velocity at the source S end of the channel. (See "Observation of Negative Differential Resistance in GaAs Field Effect Transistors," P. Muzumdar et al J. Appl. Phys. 70 (2) Jul. 15, 1991).

The tailored field can be implemented in D-mode transistors by adding a number of gates $G_I$. . . $G_n$ along the channel, between the source S and the drain D, while stepping up the bias voltage on the gates incrementally with the largest bias being applied to the gate $G_I$, nearest the source S and the smallest applied to the gate nearest the drain D.

In E-mode transistors the electron carries high speed at the beginning of the channel C and loses it toward the drain D. Therefore, a small voltage should be applied to the first gate $G_I$ while increasing the bias at the next gate and so on. An optimum ratio of gate bias voltages applied to various gates can be determined based upon the design of a given transistor, its aspect ratio and regime of operation.

SUMMARY OF THE INVENTION

The goal of current invention is to speed up an operation of conventional transistor, therefore our design is focused primarily on n-channel transistors. Although, holes are slow carriers, every finding herewith is applicable to p-channel transistors. Change of conductivity in a channel should be taken into account with regard to signs of gate and drain potentials and circuitry elements, which deliver needed polarity.

Design of a heterostructure multi-gate FET and voltage distribution at the gates should take into account the electron density in two-dimensional channel, discreteness of energy levels available for electrons and some other parameters of a heterostructure.

Since, in all considered cases the distortion of electrical field comes from drain potential, it is proper to look for remedy of the problem in automatic feedback of a drain voltage to the gate voltages and their distribution. Thus a designer of a circuitry or a customer is free to choose any value of a drain voltage, which is prescribed by an output power, while the feedback will tailor the field for the best performance of the transistor.

Early implementation of the concept of a tailored field involved the trial and error use of a variable resistor in connection with a voltage divider which was manually adjusted in a tedious, labor intensive manner to provide appropriate gate bias to the multiple gates. Accordingly, a need exists for a simpler, more controllable way of generating and coupling appropriate bias voltages to multigate FET's in the correct sequence to produce a more uniform E-field in the channel region.

In accordance with the present invention, a novel method and apparatus is provided for automatically tailoring the electric field of all types of field effect transistor (FETs) to obtain a uniform field along the transistor channel. A field effect transistor is provided with a plurality of separate gate terminals or contacts disposed laterally over a semiconductor channel formed between source and drain terminals. For D-mode transistors (MESFETs, MOSFETs and HEMTs), bias voltages on the gates are adjusted so that the absolute value of a bias voltage at the gate $G_I$ nearest the source is the largest ($V_{max}$) and the bias voltage at the gate nearest the drain $G_n$ is the lowest ($V_{min}$) ; with the voltages in the gates from $G_I$ to $G_n$ incrementally adjusted downward. For E-mode (MISFETs, MOSFETs) transistors the biases of the gates are adjusted so that bias at the gate $G_I$ nearest to the source is the lowest ($V_{min}$), and the bias voltage at the gate nearest to the drain $G_n$ is the largest ($V_{max}$) with the voltages in the gates from $G_I$ to $G_n$ incrementally adjusted upward.

For D-mode transistors, this adjustment is accomplished in one embodiment by a feedback circuit which takes the voltage applied to the drain ($V_D$), reverses its polarity, and divides it into $V_I$ . . . $V_n$ voltages; which are then applied to the $G_I$-$G_n$ gates in order of successively lower voltage. In this way, the effect of the increased drain voltage at one end of the FET is offset by the simultaneous progressive change of the gate voltages.

In an alternative embodiment for D-mode transistors, the gate biasing voltages are taken from the source terminal and appropriately divided and applied to the gates.

The biasing for E-mode n-channel transistors carries the positive polarity of the gate voltage. The gate voltages for that case are increasing from gate $G_I$ to gate $G_n$.

Figure 1:
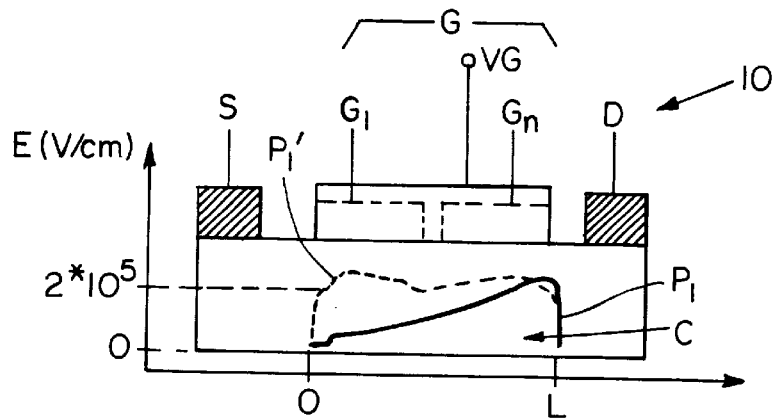
FIG. 1 is a schematic illustrating a prior art multi-gate MESFET operated in D-mode, with the electric field superimposed therein. The solid line curve $P_1$ represents the field in a single gate MESFET. The dashed curve $P_1'$ represents the field in a multi-gate MESFET.
Figure 2:
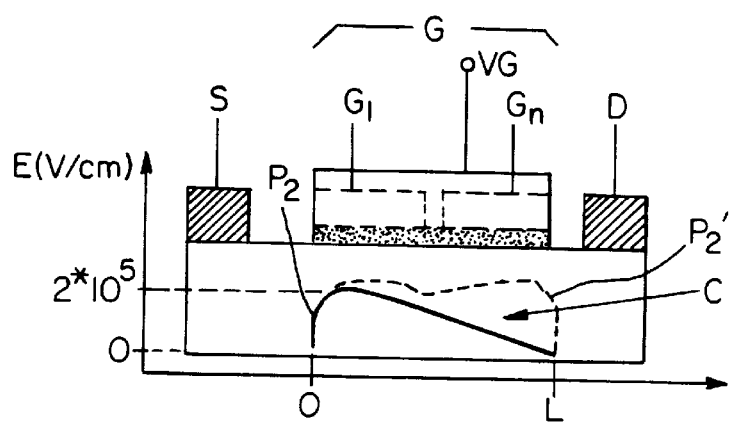
FIG. 2 is a schematic illustrating a prior art multi-gate[1]MOSFET operated in E-mode, with the electric field superimposed thereon. The solid line curve $P_2$ represents the field in a single-gate MESFET. The dashed curve $P_2'$ represents the field in a multi-gate MOSFET.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 3:
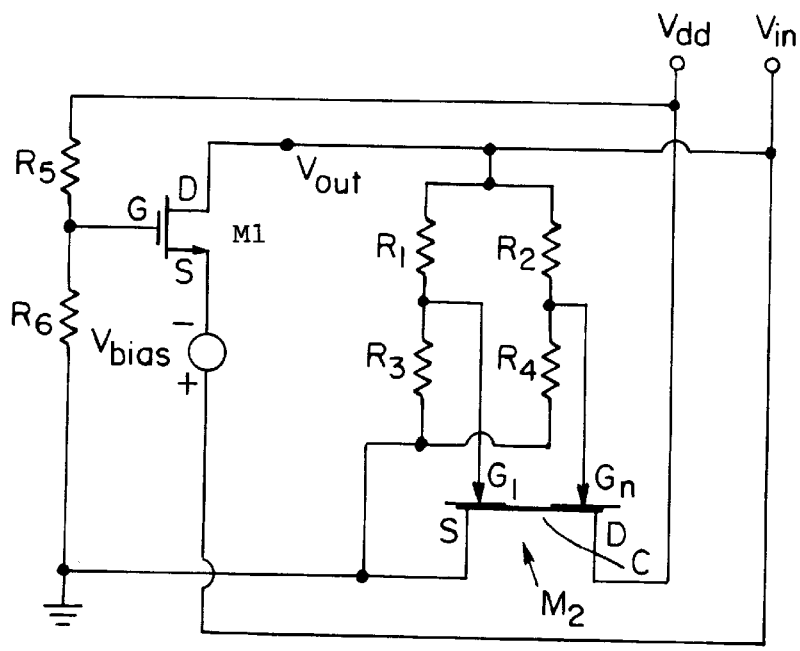
FIG. 3 is a schematic of a first embodiment of the invention.

Referring now to FIG. 3, there is shown in schematic form a detailed diagram of a first embodiment of the invention in which a multi-gate D-mode field effect transistor $M_2$ is shown to be formed with a plurality of gate electrodes $G_l$ . . . $G_n$ disposed laterally between a source S and drain D over a channel C formed on a substrate.

The magnitude of the drain voltage $V_{dd}$ (using voltage divider resistors $R_5$, $R_6$ connected in series to ground) is reduced, and the polarity of the voltage $V_{dd}$ is reversed (using enhancement mode transistor $M_1$ and the biasing voltage $V_{bias}$ in series). Preferably, transistor $M_1$ and tested transistor $M_2$ should be made from the same materials. The voltage $V_{out}$ is combined with the input voltage $V_{in}$ from the signal source (not shown), and is fed into a divider network consisting of resistors $R_1$, $R_2$, $R_3$, $R_4$. The voltage $V_{out}$ is divided in such a way that the full bias is fed to the first gate $G_l$ nearest the drain, and a fraction of it is fed to the gate $G_n$ furthest away from the drain. The gates receive a combination of the feedback bias voltage taken from the drain and the input voltage. The purpose of the feedback is to minimize the effect of the drain voltage on the electric field in the channel; the increase of the drain voltage $V_{dd}$ is compensated by the simultaneous increase of the gate voltages at gates $G_l$ . . . $G_n$.

Figure 4:
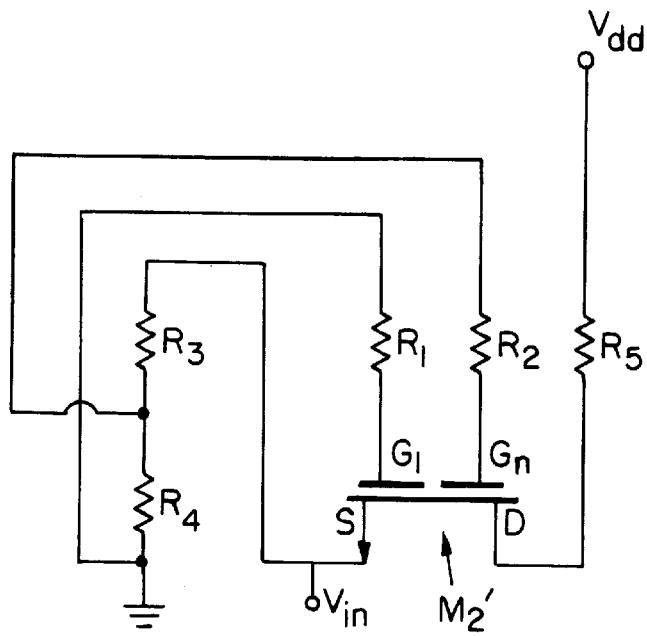
FIG. 4 is a schematic of a second embodiment of the invention.

FIG. 4 shows another feedback circuit for a multi-gate D-mode MOSFET $M_2'$. In this case the feedback is taken from the source terminal S of the transistor $M_2'$ and is reduced by voltage drop across divider $R_3/R_4$ and fed to the respective gates $G_l$ $G_n$ after being further reduced incrementally across respective fixed resistors $R_1$, $R_2$ ($R_n$) in series with gates $G_l$ . . . $G_n$. An important feature of this circuit is that it is a self-biasing circuit. Voltages taken from resistors $R_l$, $R_n$ are lower than the source voltage. Therefore, the biasing gate voltages will be negative with respect to the source. Resistors $R_3$, $R_4$ provide additional control for the ratio of the gate voltages. The voltage input $V_{in}$ is coupled to the source terminal S.

Figure 5:
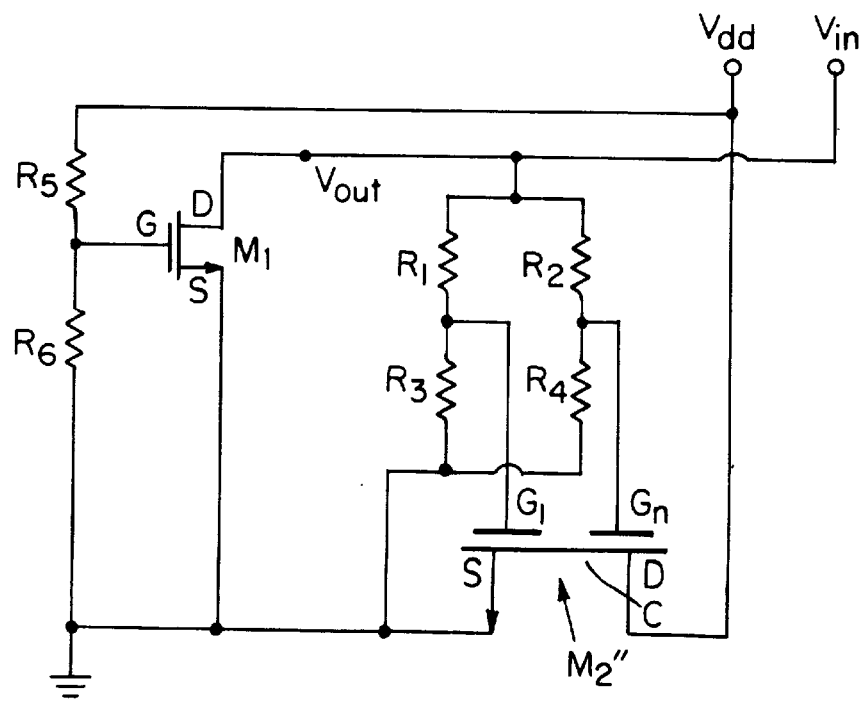
FIG. 5 is a schematic of a third embodiment of the invention.

FIG. 5 presents a feedback circuit for a multi-gate E-mode MOSFET operation. Here, a multi-gate E-mode field effect transistor $M_2''$ is shown to be formed with plurality of gate electrodes $G_l$, $G_n$ disposed laterally over a channel C formed on a semiconductor substrate and insulated from source and drain contacts by an oxide insulator (not shown).

The magnitude of the drain voltage $V_{dd}$ is reduced using divider resistors $R_5$, $R_6$, and enhancement mode transistor $M_1$. However, unlike the circuit of FIG. 3 for D-mode operation, in FIG. 5 there is no need to reverse the polarity. Preferably, transistor $M_1$ and tested transistor $M_2$ should be made form the same materials. The voltage $V_{out}$, is combined with the signal voltage $V_{in}$ from the signal source, and it is fed into a divider network consisting of resistors $R_1$ and $R_3$ in series to ground and $R_2$ and $R_4$ in series to ground with gate $G_l$ coupled between $R_1$ and $R_3$ and gate $G_n$ coupled to the junction between $R_2$ and $R_4$. The voltage is therefore divided in such a way that the full bias is fed to the gate closest to the drain $G_n$, and a fraction of it is fed to the gate $G_l$. As explained above, the gates receive a combination of the feedback bias voltage taken from the drain and the signal voltage. The purpose of the feedback is to minimize the effect of the drain voltage on the electric field in the channel; the increase of the drain voltage is compensated by the simultaneous increase of the gate voltages.

Comparison of the circuits of FIG. 3 and FIG. 4 is given in the Table 1 below:

TABLE 1

Comparison of the Two Feedback Circuits

|  | Circuit (FIG. 3) | Circuit (FIG. 4) |
| --- | --- | --- |
| Advantages | 1) No gain loss<br>2) No current limitation | 1) Less components |
| Disadvantages | 1) More components | 1) Current limitation<br>2) Gain loss |

Equivalents

Having thus described a few particular embodiments of the invention, various alterations, modifications and improvements will readily occur to those skilled in the art. Such alterations, modifications and improvements, as made obvious by this disclosure, are intended to be part of this description though not expressly stated herein, and are intended to be within the spirit and scope of the invention. Accordingly, the foregoing description is by way of example only, and not limiting. The invention is limited only as defined in the following claims and equivalents thereto.

For example, while the experimental data and measurements as taken in connection with MESFET devices it is applicable to any type of FET device, such as JFETs, MISFETs & MOSFETs of D and E modes of operation, as well as the heterostructure FETs employing gate terminals disposed between source and drain terminals over a channel. Various types of semiconductors are also contemplated including without limitations Si, GaAs devices and other III–IV and mixed III–V compound semiconductors.

It should also be noted that although the gate, drain and source elements may have been referred to interchangeably as terminals, regions, contacts and electrodes, in reality the elements may consist of n or p type semiconductor regions upon which ohmic contacts are formed.

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

What is claimed is:

1. A voltage divider circuit for automatically adjusting bias voltages applied to a plurality of gates of a transistor having a source contact and a drain contact with the plurality of gates disposed therebetween over a channel region on a semiconductor substrate and wherein an input voltage applied to the voltage divider circuit is summed with a voltage such that a respective bias voltage on a respective gate differs incrementally from a next adjacent gate.

2. The circuit of claim 1 wherein the transistor is operated in a D-mode and a gate closest to the source is provided with a highest bias voltage while a gate nearest the drain is provided with a lowest bias voltage.

3. The circuit of claim 1 wherein the transistor is operated in an E-mode and a gate closest to the drain is provided with a highest bias voltage while the gate nearest the source is provided with a lowest bias.

4. The circuit of claim 1 wherein the input voltage is linearly amplified by the transistor, due to uniform linear transconductance $G_m$ of the transistor.

5. The circuit of claim 1 wherein a gate capacitance $C_{gs}$ of the transistor is significantly decreased, and that in turn results in higher speed of the transistor operation.

6. A D-mode field effect transistor for amplifying an input voltage is comprised of a source contact and a drain contact with a plurality of gate contacts $G_1 \ldots G_n$ disposed laterally over a channel region and wherein a plurality of respective gate voltages $V_1$–$V_n$ are provided by a voltage divider circuit coupled to said input voltage and are applied to a respective gate $G_1 \ldots G_n$ such that the highest of said gate voltages, $V_{max}$, is applied to gate $G_1$ wherein gate $G_1$ is the closest gate to the source contact and the lowest voltage $V_{min}$ is applied to the gate $G_n$ nearest the drain contact.

7. An E-mode field effect transistor for amplifying an input voltage is comprised of a source contact and drain contact with a plurality of gate contacts $G_1 \ldots G_n$ disposed laterally over a channel region and wherein a plurality of respective gate voltages $V_1$–$V_n$ are provided by a voltage divider circuit coupled to said input voltage and are applied to a respective gate $G_1 \ldots G_n$ such that the highest of said gate voltages $V_{max}$ is applied to the gate $G_n$ nearest the drain contact and the smallest to the gate contact $G_1$ nearest to source contact.

8. A voltage divider circuit for automatically adjusting bias voltages applied to a plurality of gates of a field effect D-mode transistor having a source contact and a drain contact with the plurality of gates disposed therebetween over a channel region on a semiconductor substrate and wherein an input voltage is applied to a voltage divider circuit and summed with a voltage such that a bias voltage on a respective gate differs incrementally from a next adjacent gate and wherein the voltage is inverted in polarity prior to being summed with the input voltage.

9. The circuit of claim 8 wherein a gate closest to the source is provided with a highest bias voltage while a gate nearest the drain contact is provided with a lowest bias voltage.

10. A D-mode field effect transistor for amplifying an input voltage is comprised of a source contact and a drain contact with a plurality of gate contacts $G_1 \ldots G_n$ disposed laterally over a channel region and wherein a plurality of respective gate voltages $V_1$–$V_n$ are provided by a first voltage divider circuit coupled to said input voltage and wherein a bias voltage is coupled to a second voltage divider circuit and reversed in polarity and combined with said input voltage to produce said gate voltages which are applied to a respective gate $G_1 \ldots G_n$ such that the highest of said gate voltages $V_{max}$, is applied to gate $G_1$, wherein gate $G_1$, is the closest gate to the source contact and the lowest voltage $V_{min}$ is applied to the gate $G_n$ nearest the drain contact.

11. The transistor of claim 10 wherein the bias voltage is reversed by a transistor $M_1$ coupled to the first voltage divider circuit.

12. A method for automatically adjusting bias voltages applied to a plurality of gates of a transistor having a source contact and a drain contact with the plurality of gates disposed therebetween over a channel region on a semiconductor substrate comprising the steps of:

applying an input voltage $V_{in}$ to a voltage divider circuit; and summing the input voltages with a gate bias voltage to produce said bias voltages, and applying a respective bias voltage to a respective gate such that the bias voltage on a respective gate differs incrementally from a next adjacent gate.

13. The method of claim 12 wherein the transistor is operated in a D-mode and a gate closest to the source is provided with a highest bias voltage while a gate nearest the drain is provided with a lowest bias voltage.

14. The circuit of claim 12 wherein the transistor is operated in an E-mode and a gate closest to the drain is provided with a highest bias voltage while a gate nearest the source is provided with a lowest bias.

15. A method for amplifying an input voltage in a transistor having a source contact and a drain contact with a plurality of gate contacts $G_1 \ldots G_n$ disposed laterally over a channel region comprising the steps of:

coupling respective gate voltages $V_1$–$V_n$, provided by a voltage divider circuit which is coupled to said input voltage, to a respective gate $G_1 \ldots G_n$ such that a highest of said gate voltages, $V_{max}$, is applied to gate $G_1$ wherein gate $G_1$ is the closest gate to the source contact and a lowest voltage $V_{min}$ is applied to the gate $G_n$ nearest the drain contact.

16. A method for amplifying an input voltage in an E-mode FET having a source contact and drain contact with a plurality of gate contacts $G_1 \ldots G_n$ disposed laterally over a channel region comprising the steps of coupling respective gate voltages $V_1$–$V_n$, provided by a voltage divider circuit which is coupled to said input voltage, to a respective gate $G_1 \ldots G_n$ such that a highest of said gate voltages $V_{max}$ is applied to the gate $G_n$ nearest the drain contact and the smallest to the gate contact $G_1$ nearest to the source contact.

17. The method of claim 16 wherein the input voltage is linearly amplified by the transistor due to uniform transconductance $G_m$ of the transistor.

* * * * *